(12) United States Patent
Yang (10) Patent No.: US 9,716,194 B2
(45) Date of Patent: Jul. 25, 2017

(54) THIN FILM SOLAR CELL STRUCTURE

(71) Applicant: Chihhua Yang, New Taipei (TW)

(72) Inventor: Chihhua Yang, New Taipei (TW)

( * ) Notice: Subject to any disclaimer, the term of this patent is extended or adjusted under 35 U.S.C. 154(b) by 0 days.

(21) Appl. No.: 14/568,696

(22) Filed: Dec. 12, 2014

(65) Prior Publication Data

US 2015/0096614 A1    Apr. 9, 2015

Related U.S. Application Data

(63) Continuation-in-part of application No. 13/461,382, filed on May 1, 2012, now abandoned.

(51) Int. Cl.

| | |
|---|---|
| *H01L 31/044* | (2014.01) |
| *H01L 31/0236* | (2006.01) |
| *H01L 31/0352* | (2006.01) |
| *H01L 31/056* | (2014.01) |
| *H01L 31/054* | (2014.01) |

(52) U.S. Cl.
CPC .. *H01L 31/02366* (2013.01); *H01L 31/03529* (2013.01); *H01L 31/056* (2014.12); *H01L 31/0547* (2014.12); *Y02E 10/52* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | | |
|---|---|---|---|---|
| 2008/0210294 | A1* | 9/2008 | Moslehi | H01L 31/042 136/251 |
| 2009/0325336 | A1* | 12/2009 | Abbott | H01L 21/0243 438/57 |
| 2011/0232744 | A1* | 9/2011 | Larsen | H01L 31/0236 136/256 |
| 2012/0031454 | A1* | 2/2012 | Fogel | H01L 31/03529 136/244 |
| 2013/0125969 | A1* | 5/2013 | de Groot | H01L 31/02366 136/256 |

* cited by examiner

*Primary Examiner* — Bach Dinh
(74) *Attorney, Agent, or Firm* — Chun-Ming Shih; HDLS IPR Services (57) ABSTRACT

A thin film solar cell includes a protection layer, a substrate and a photovoltaic conversion structure having a stack of one or several of non-planar light absorption layers, a first conductive layer being light transmissive and a second conductive layer being at least partially transparent or totally reflective. When the second conductive layer is totally reflective, it reflects the sunlight to the adjacent part of the thin film solar cell, proceeding another photovoltaic conversion and generating electric power again. If the non-planar light absorption layer is sloped enough, there will be several photovoltaic conversions produced by the same incident sunlight. More power will be generated and the efficiency of conversion is increased. If the second conductive layer is at least partially transparent, the incident light will be reflected less. However, the structure will provide several opportunities of photovoltaic conversions for the light with larger incident angle.

16 Claims, 10 Drawing Sheets

THIN FILM SOLAR CELL STRUCTURE

CROSS-REFERENCE

This application is a continuation-in-part of U.S. patent application Ser. No. 13/461,382, filed on May 1, 2012.

BACKGROUND OF THE INVENTION

Field of the Invention

The present invention relates to a thin film solar cell structure which causes two or more reflections for an vertically incident sunlight and thus more photovoltaic conversions are produced by every single vertically incident light. More electric power is therefore generated and the photovoltaic conversion efficiency is improved.

Description of Related Art

Solar cell is a device which converts solar power to electric power. It can be categorized, in material, to silicon type, compound type and organic type. It can also be categorized to bulk type and thin film type in other way. Take silicon type solar cell as an example, usually single-crystalline silicon solar cells and poly-crystalline silicon solar cells belong to bulk type while amorphous silicon solar cells and micro-crystalline solar cells silicon belong to thin film type.

The light absorption layer, the first conductive layer and the second conductive layer for a traditional thin film solar cells are substantially planar. Therefore the sunlight can't be reused as it is reflected by the second conductive layer and leave the solar cell. Some attempts have been put forward to increase the possibility for the incident sunlight to stay longer in the light absorption layer. For example, some method changes the path of the reflection light with a rough surface of the second conductive layer and the reflection light will be reflected totally back to the solar cell when it arrives at the cell-air interface. However, it does not happen on all of the reflected light. Another prior art tries to increase the possibility of a second reflection back to the light absorption layer for the reflected light by changing the path of the light in the light absorption layer (with a textured stack of first conductive layer, light absorption layer and second conductive layer, which is called as photovoltaic conversion structure in this document). However, it causes additional reflection loss of the incident sunlight when it arrives at the interface between the first conductive layer and the light absorption layer. As mentioned above, these methods improve the possibility to keep the incident sunlight staying longer in the photovoltaic layer only. Some reflected light still leaves the cell directly.

SUMMARY OF THE INVENTION

The present invention relates to a non-planar thin film photovoltaic conversion structure which causes several reflections for almost every single vertically incident photon. Therefore more photovoltaic conversion is produced, more power is generated and the power efficiency is increased. The most obvious differences of the present invention from the prior art mentioned above are:

1. The vertical distance between the peak and the valley of the light absorption layer is at least larger than or equal to its thickness in the present invention. Therefore, almost every photon of the incident sunlight which is not absorbed by the light absorption layer will be reflected by the second conductive layer and go through the light absorption layer and proceed photovoltaic conversion again. The rest photons will go somewhere else at the solar cell and proceed photovoltaic conversion again. Same procedure will repeat again and again till the light leave the non-planar thin film solar cell. While the vertical distance between the peak and the valley of the texture in the prior art mentioned above is smaller than the thickness of the light absorption layer. The purpose of the texture with small dimension is to scatter the incident sunlight or the reflected light and increase the possibility for the light going back and forth in the photovoltaic conversion structure. But there still is some of the light leaves the photovoltaic conversion structure directly or after only one or two reflections.

2. The slope of the non-planar light absorption in the present invention is larger. All solar cells with a non-planar surface suffer from the increasing reflection loss at the interface between the first conductive layer and the light absorption layer. With a larger slope, the reflected light related to reflection loss in the present invention does not leave the solar cell directly as in the prior art but go somewhere else of the solar cell and proceed photovoltaic conversion again. If the reflection loss shows up again at the "somewhere", same procedure as mentioned above will be proceeded again till the light leave the solar cell. However, the reflection loss is minimized at last with several times of the reuse of the reflection losses.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

Figure 1A:
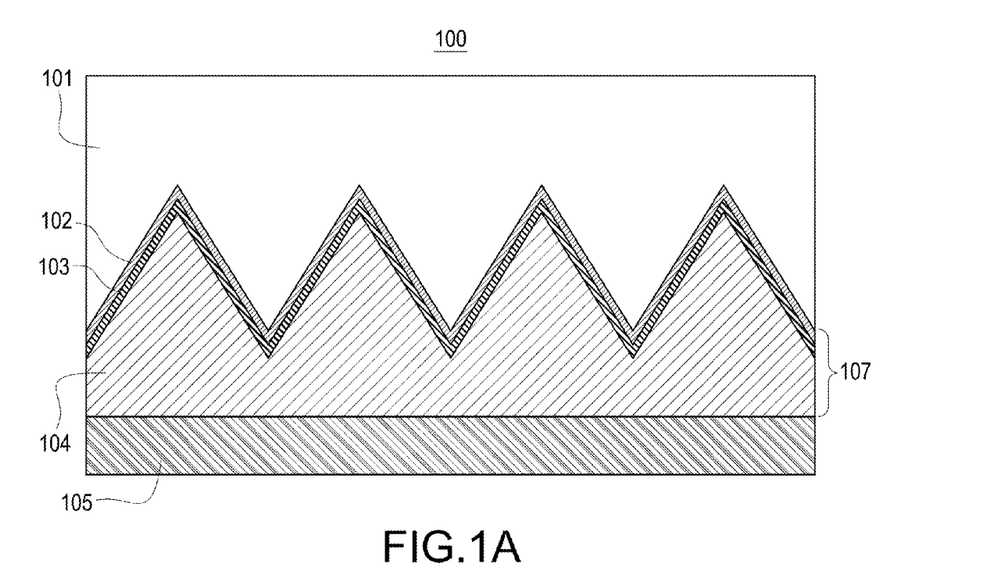
FIG. 1A shows a vertical cross-sectional view of a structure for a thin film solar cell according to the present invention.
Figure 1B:
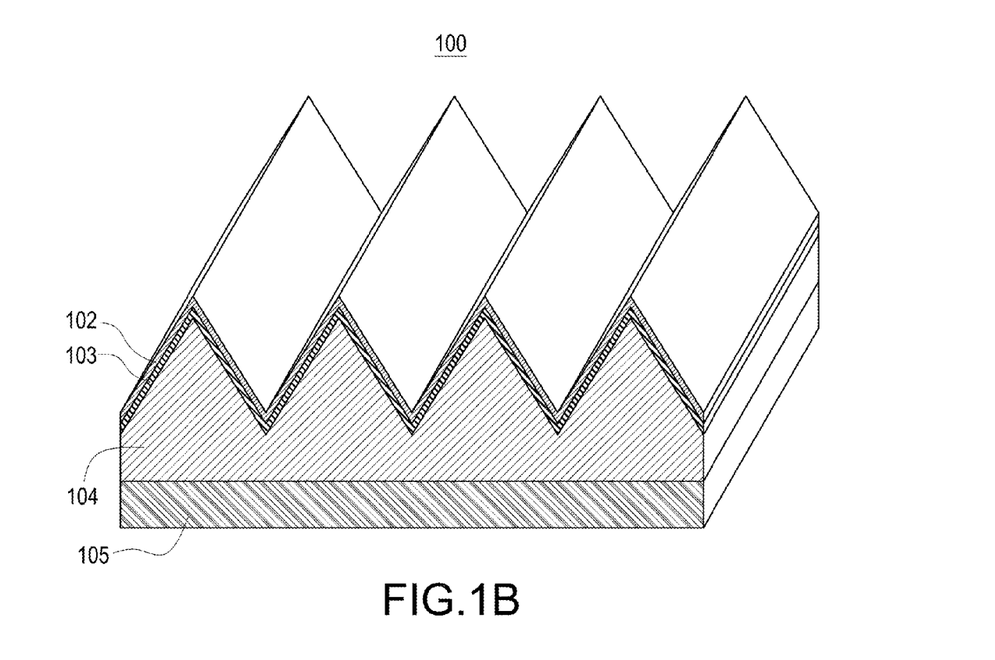
FIG. 1B shows a perspective view of the thin film solar cell in FIG. 1A.

FIG. 1A is a vertical cross-sectional view of an embodiment of the present invention which can be applied in a thin film solar cell, for example, silicon type solar cell, compound type solar cell and dye-sensitized solar cell . . . etc. The incident sunlight is reflected for several times(namely, has multiple reflections) to increase the power conversion efficiency in the photovoltaic conversion structure of thin film solar cell structure 100. Thin film solar cell structure 100 comprises a photovoltaic conversion structure 107 and an optional protection layer 101 and an optional substrate 105. Photovoltaic conversion structure 107 is a stack of an at least one layer of non-planar light absorption layer 103, a light transmissive first conductive layer 102 (For example, ITO or AZO) and an at least partially transparent or completely reflective second conductive layer 104. FIG. 1B shows a perspective view of the embodiment shown in FIG. 1A, where the optional protection layer 101 is not depicted for better demonstration. It should be noted that the embodiment shown in FIG. 1B is corresponding to thin film solar cell with a non-planar light absorption layer having an undulated non-planar vertical cross-sectional structure in one dimension. The thin film solar cell in the present invention can also have non-planar light absorption layer having undulated non-planar vertical cross-sectional structures in two dimensions and will be described later.

Moreover, when the disclosure mentions that layer A is "arranged" on or under layer B, it does not mean that layer A is necessary to be in direct contact with the layer B. On the contrary, the layer A can be physically separated with the layer B and at least one other layer can be sandwiched between the layer A and the layer B.

Figure 1C:
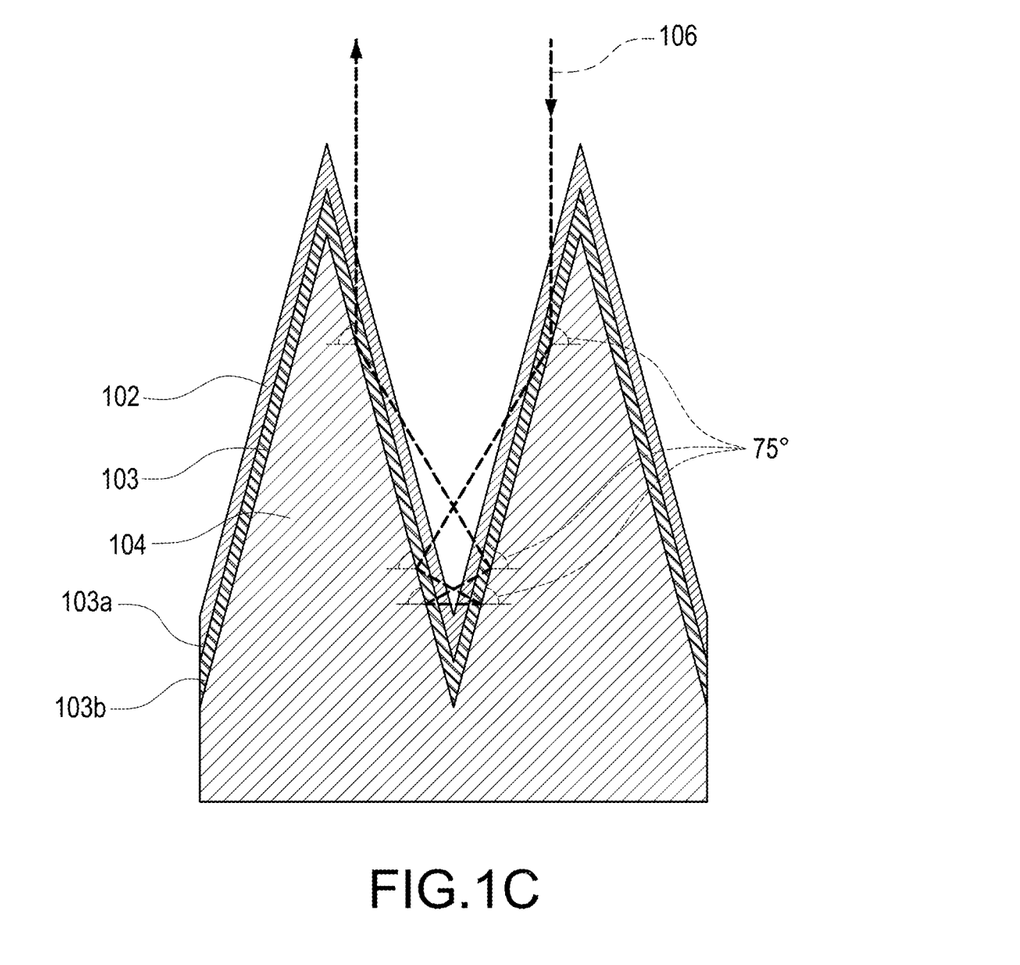
FIG. 1C shows how a vertically incident light has several reflections in the present invention, which has a slope with a 75° angle. For simplicity and clarity, the refraction angles at the interfaces between layers are not shown.

More particularly, with also reference to FIG. 1C, the non-planar light absorption layer 103 has a first face 103a arranged under the first conductive layer 102, and a second face 103b opposite to the first face 103a and arranged on the second conductive layer 104. In operation of the solar cell of the present invention, the surface of the second conductive layer 104 adjacent to the second face 103b functions as a reflection face to guide the light back to the non-planar light absorption layer 103. The second conductive layer 104 has a base face (not labeled, adjacent to the substrate 105) opposite to the second face 103b.

First conductive layer 102 has uneven undulation (such as zigzag fashion as shown in FIG. 1A) substantially along with light absorption layer 103 and an optional protection layer 101 or anti-reflection treatment such as a texture may be added on its surface away from light absorption layer 103. First conductive layer 102 may also apply an optional anti-reflection treatment on the first face 103a.

As mentioned above, an optional conductive buffer layer (not shown) can be added between first conductive layer 102 and light absorption layer 103 to prevent the conversion efficiency being affected just as the case in CIS/CIGS thin film solar cells. An optional conductive buffer layer(not shown) such as ITO can also be added between second conductive layer 104 and light absorption layer 103 just as the case in some amorphous silicon thin film solar cells. The material for protection layer 101 can be glass, transparent acrylic, transparent plastic or other transparent materials.

The surface of protection layer 101 which is away from first conductive layer 102 has uneven undulation along with first conductive layer 102 or is planar as shown in FIG. 1A and an optional anti-reflection treatment can be added on it. Second conductive layer 104 may optionally apply a rough surface in the prior art mentioned above on its surface adjacent to the second face 103b. Because it is a prior art, no further detail will be discussed here. The base face of second conductive layer 104 which is away from light absorption layer 103 can be configured to have uneven undulation along with light absorption layer 103 or be planar as shown in FIG. 1A alternatively.

When solar cell structure 100 is applied in a "substrate" structure, a substrate 105 which is made of glass, stainless steel, acrylic, plastic or other materials can be added optionally under the surface of second conductive layer 104 which is away from light absorption layer 103. An optional isolation layer can be added between second conductive layer 104 and substrate 105. When solar cell structure 100 is applied in a "superstrate" structure, substrate 105 is not necessary.

Light absorption layer 103 is a place where the photovoltaic conversion take place. For example, when the structure is applied in a traditional amorphous silicon solar cell, light absorption layer 103 is the stack of a p-type amorphous silicon layer, an intrinsic amorphous silicon layer and an n-type amorphous silicon layer. Because it is a prior art, no further detail will be discussed here.

Figure 1D:
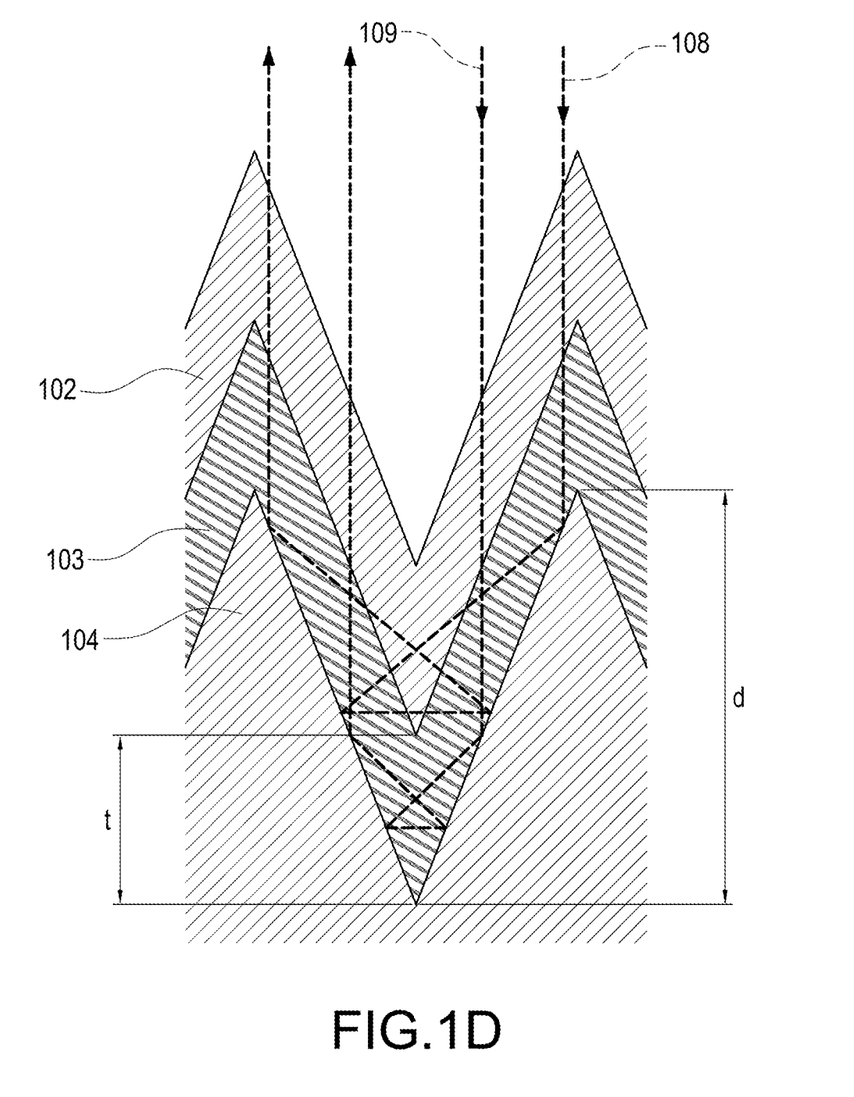
FIG. 1D shows that when the vertical distance d between the peak and the valley of the non-planar light absorption level is bigger than its thickness t, the accumulated journey in the light absorption layer of partial vertical incident lights can achieve the ideal value and more electrical power is generated. For simplicity and clarity, the refraction angles at the interfaces between layers are not shown.

According to a preferred embodiment of the present invention in FIG. 1D, the vertical distance d between the adjacent peak and valley of light absorption layer 103 is larger than its thickness t (for example, larger than the thickness t or three times of the thickness t) and the slope of light absorption layer is not less than 45° (FIG. 1C shows an example with a 75° slope). After being photovoltaic converted, therefore, the remaining light is reflected by second conductive layer 104 and go somewhere at the opposite side of the V-groove and being converted again. Same procedure is repeated till the remaining light leave the non-planar area.

For the light absorption layer with the same thickness t and the same slope, the light absorption layer with larger value of d achieves an ideal length of the accumulated journey in light absorption layer 103 for more vertical incident lights; and hence more electrical power can be generated in light absorption layer with larger value of d. As FIG. 1D shows, obviously, light 108 has longer accumulated journey in light absorption layer 103 and hence more electrical power generated than light 109 does. If d is not larger than t, no vertical incident light can generate as much electrical power as light 108 does. Only when d is larger than t, some of the vertical incident light can generate more power as light 108 does. And the larger value of d/t stands for more percentage of the vertical incident light which can generate more electrical power. Another reason for larger d in comparison with t under the condition of the same thickness t and the same slope is, more or less, some areas with relatively flat slope are present around the peaks and the valleys in practical devices. The relatively flat areas can not create multiple reflections for the vertical incident light, which will be discussed in detail later, and therefore the total power conversion efficiency is affected. For non-planar light absorption layer 103 with predetermined thickness t and slope, the one with larger d/t ratio is less influenced by the relative flat area, namely, the relative flat area has smaller percentage on a horizontal region with specific area. Hence the total power conversion efficiency can be closer to the ideal value. For certain applications, the vertical distance d between the adjacent peak and valley of non-planar light absorption layer 103 is more than ten times of its thickness t.

First conductive layer 102 is made of either a single conductive material or several conductive materials. Second conductive layer 104 is also made of either a single conductive material or several conductive materials. According to a preferred embodiment in the present invention, second conductive layer 104 is a completely reflective electrode for an optimized power conversion efficiency. If it is necessary such as the case in BIPV discussed later, an at least partially transparent material can optionally be used for second conductive layer 104. That is, materials of different reflection rate can be selected for second conductive layer 104 on demand. For certain applications, materials with reflection rate more than 20% is suggested for second conductive layer 104. According to one example, the reflection rate is larger than 40%. According to another example, the reflection rate is larger than 60%.

Figure 3A:
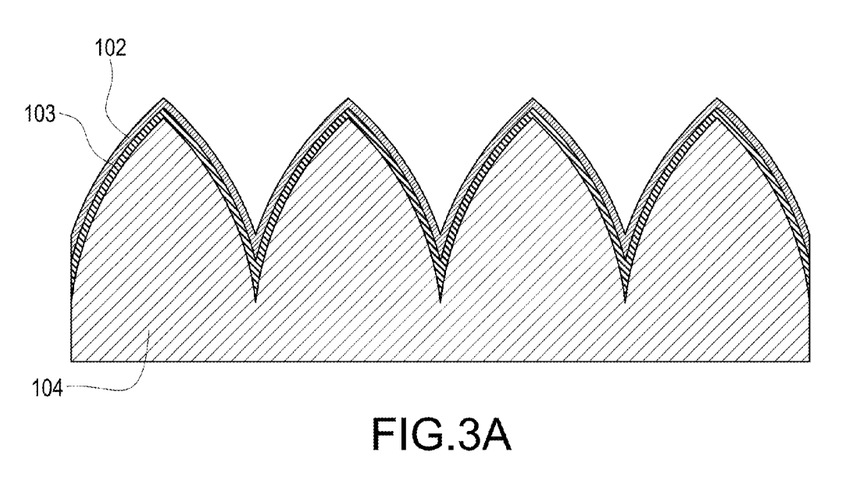
FIG. 3A shows a progressive type non-planar light absorption layer.
Figure 3B:
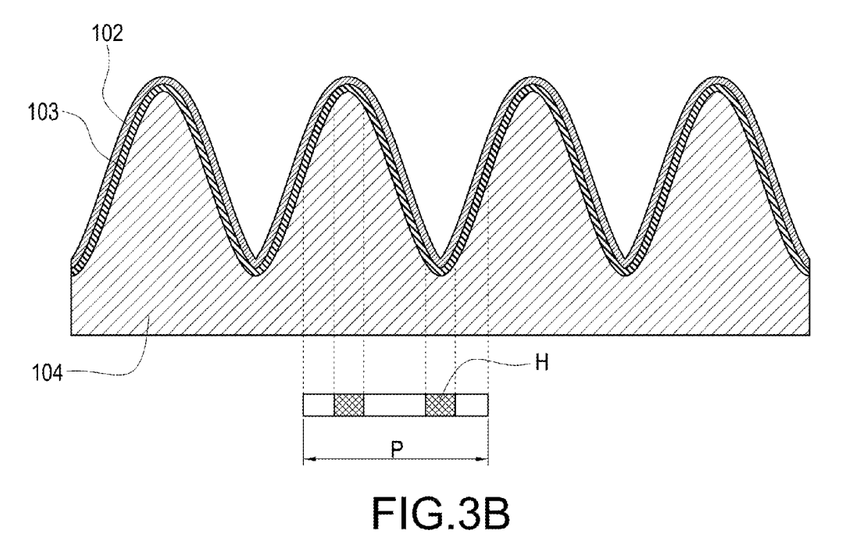
FIG. 3B shows a wave type(sine wave or sine-wave-like) non-planar light absorption layer.

When second conductive layer 104 is completely reflective (namely, the reflection rate is nearly 100%), the remaining light after a photovoltaic conversion is completely reflected to somewhere else in the solar cell and is photovoltaic converted to the electrical power again. The number of photovoltaic conversions for a vertically incident light relates to the slope of the interface between light absorption layer 103 and second conductive layer 104 at the reflection point. When the angle of the slope is not less than 45°, every vertically incident light may has several photovoltaic conversions for more electrical power and increase the conversion efficiency. Take FIG. 1C as an example, when the angle is 75°, second conductive layer 104 reflects vertically incident light 106 for six times to render six chances for reacting and generating electrical power in light absorption layer 103. When the angle is 60°, every vertically incident light has three reflections to render three chances for reacting and generating electrical power in the light absorption layer. When the angle is 45°, every vertically incident light has two reflections to render two chances for reacting and generating electrical power in the light absorption layer for the same reason. With reference also to FIG. 3B, the solar cell has nearly regular undulation profile with pitch (period) P and the slope of the undulation is relatively flat at the peak and the valley of the profile. For the portion of the light absorption layer 103 with inclination angle of the slope with respect to a horizontal line (for example, the flat base face as shown in FIG. 1A) being less than 45°, the portion is defined as relatively flat portion. The relatively flat portion has a horizontal projection H on the artificial horizontal plane, and the ratio of H/P is preferably less than 50%. According to one example, the inclination angle for the definition of relatively flat portion is less than 50°. According to another example, the inclination angle for the definition of relatively flat portion is less than 60°. In the embodiment shown in FIG. 1C, both adjacent sides of the peak of the light absorption layer 103 have the same angle of 75°. However, they may have different angles. Both adjacent valleys may also be at different levels and so does the adjacent peaks.

Figure 2:
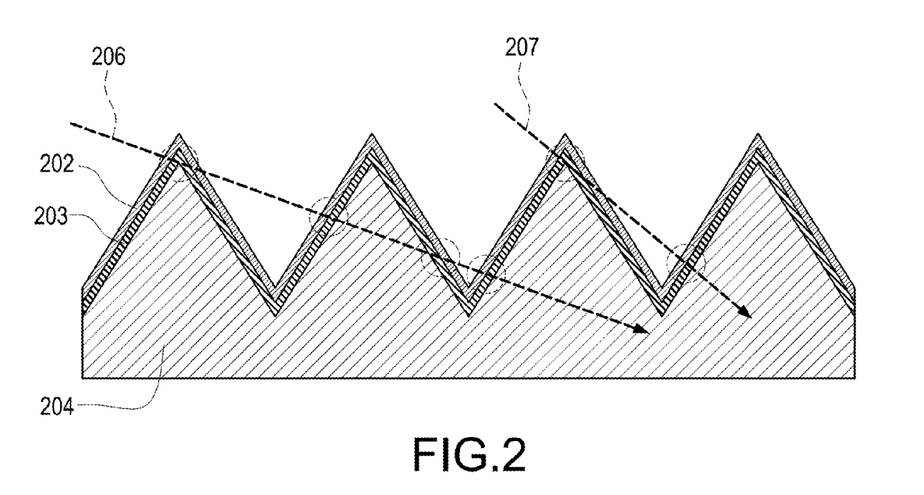
FIG. 2 shows that incident light with a larger incident angle has several chances of photovoltaic conversion when the second conductive layer is partially transparent. For simplicity and clarity, the refraction angles at the interfaces between layers are not shown.

According to the practical usage, such as the building application, solar cells are demanded to be partially transparent so that second conductive layer 204 has to use a material which is at least partially transparent. At this moment, the incident light on second conductive layer 204 results in not only a reflected light but also a transmitted light. The reflected light is weaker in comparison with it on a completely reflective second conductive layer. As shown in FIG. 2, however, a chance of several photovoltaic conversions in light absorption layer 203 is provided for lights with large incident angle such as light ray 206 and light ray 207 because of the transmitted light.

When more than one layer of light absorption layer is used, a combination of light absorption layers with different absorption spectrum can be arranged to increase the absorption range in the spectrum for the incident light and buffer layers can be added between the light absorption layers.

Figure 3C:
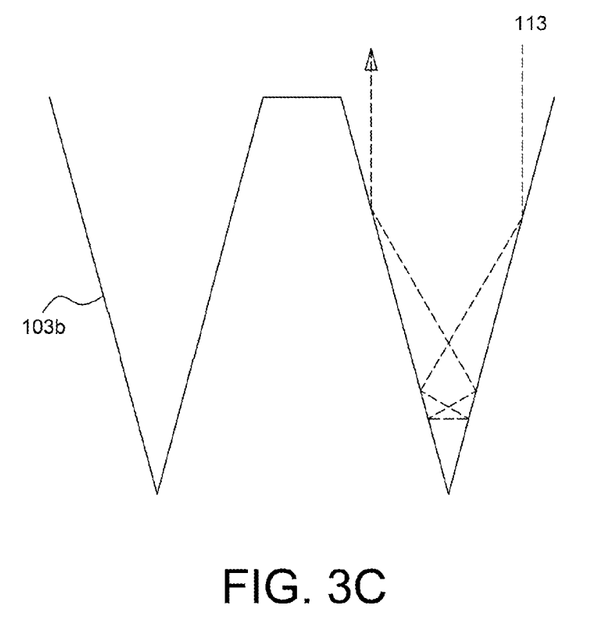
FIG. 3C shows the effect of the existence of a relatively flat portion on the peak (in comparison with FIG. 1C).
Figure 3D:
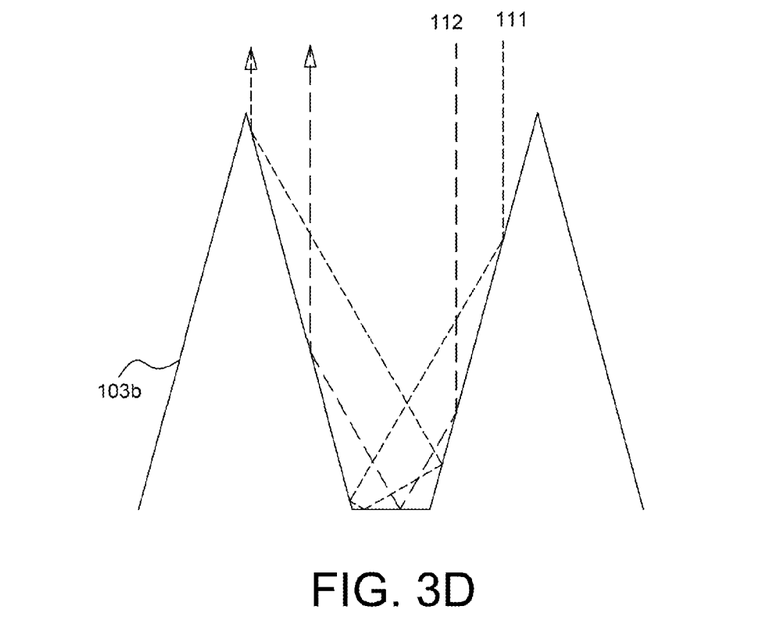
FIG. 3D shows the effect of the existence of a relatively flat portion on the valley (in comparison with FIG. 1C).

In addition, the slope at the interface between the second conductive layer 104 and the light absorption layer 103, that is the slope of light absorption layer 103, may also varies with its position, for example, a gradual change type structure. FIG. 3A shows one of the embodiments for the gradual change type structure, which is called as progressive type structure. In comparison with the case with a substantially fixed slope, a progressive type structure with the same slope at the peak has more reflections because the closer to the valley, the larger the slope is. FIG. 3B shows another embodiment of gradual change type structure, which shows a sine wave or a sine-wave-like curve in the vertical cross-sectional view. The structure takes benefits from the manufacturing and physical characteristics while the shortcoming is the smaller slopes at the relatively flat portion. The slopes at those areas are smaller than 45°, which has only one chance of photovoltaic conversion. Therefore, the proportion of the horizontal projection of the relatively flat portion of light absorption layer 103 (with the slope smaller than 45°, indicated by meshed part H shown in FIG. 3B) with respect to the whole cycle P in FIG. 3B, has to be minimized to less than 50% (or even better, less than 25%) to prevent the conversion efficiency affected too much (It should be noted that the symbol H indicates to total length of the meshed part in FIG. 3B). In addition, so called "varies with its position" can also mean piecewise slopes, such as a combination of several different and substantially fixed slopes, a combination of several different gradual change slopes or a combination of both. The meshed part H in FIG. 3B indicates the relatively flat portion with a slope smaller than 45° on both the peak and the valley. Between them, the relatively flat portion on the valley degrades the performance of solar cell more than the relatively flat portion on the peak does. For example, a vertical incident light in an embodiment shown in FIG. 1C has six contact points with the thin film solar cell and therefore has six chances to be converted to electrical energy. If there are relatively flat portion on the peaks as shown in FIG. 3C, only the incident light on the peaks will be affected where the chances of being converted from six is down to one, while the incident light 113 outside the relatively flat portion at the peaks won't be affected and have 6 chances of being converted still. If the relatively flat portion is on the valleys instead, not only the light on the valleys are affected where the chances of being converted from six is down to one, but also the incident light outside the relatively flat portion at the valleys will be affected with fewer chances of being converted. As shown in FIG. 3D, incident light 111 has only five chances to be converted while incident light 112 has only three chances. To simplify the illustration, only the second face of the light absorption layer 103b is shown in FIG. 3C and FIG. 3D as a reflection interface. If a thin film solar cell in the present invention has some relatively flat portion, it will be better that the horizontal projection of the relatively flat portion on the valley has no more area than the horizontal projection of the relatively flat portion on the peak does. In one embodiment of the present invention, the horizontal projection of the relatively flat portion on the valley is not more than 8.5% of the horizontal projection of the whole cycle P.

Figure 4A:
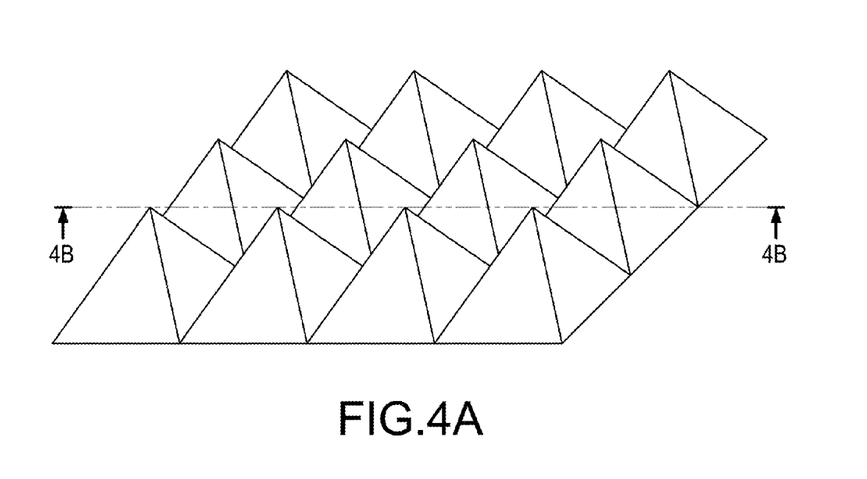
FIG. 4A shows one of the embodiments with the pyramids. For simplicity and clarity, only the interface between the second conductive layer and the light absorption layer is shown.
Figure 4B:
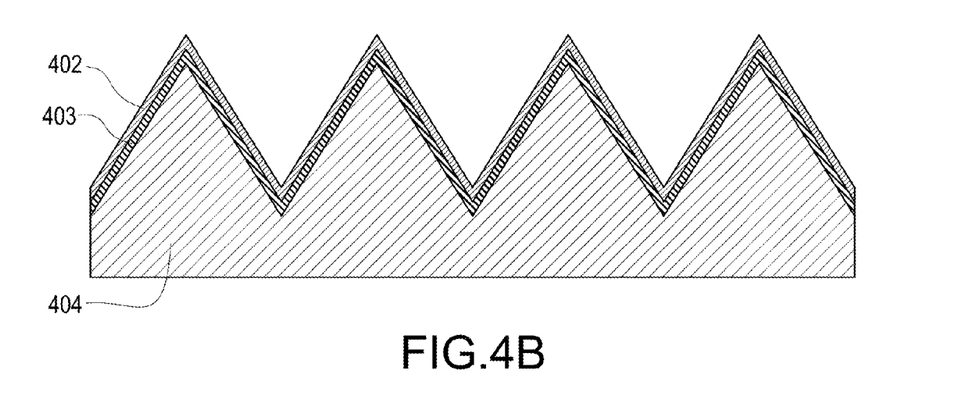
FIG. 4B is a vertical cross-sectional view along the peaks of the pyramids in FIG. 4A.

What mentioned above is a discussion about a non-planar light absorption layer with an undulated non-planar vertical cross-sectional structure in one dimension. When the structure of the present invention is applied in two-dimensional case, it can be visualized as side walls for cones, inverted cones, pyramids, inverted pyramids, prisms which lie down horizontally or a mix of them in close proximity to each other. The cones, pyramids, or prisms may be the ones with any shape (such as polygon) in their horizontal cross-section such as triangular pyramids, square pyramids or irregular mountains. It should be noted that basically the light absorption layer 403 is a 3D layered structure with relatively thin thickness and relatively wide length and width. The example shown in FIG. 1B is referred as light absorption layer 403 with one dimensional undulation, namely it has undulation along vertical section of width or length direction. The examples shown in FIG. 4A is referred as light absorption layer 403 with two dimensional undulations, namely it has undulation along vertical sections of width and length direction. FIG. 4A shows one of the embodiments with the pyramids and FIG. 4B is a vertical cross-sectional view including the peak of the pyramids along vertical sections of width or length direction of the light absorption layer 403. In FIG. 4B, light absorption layer 403, first conductive layer 402 and second conductive layer 404 show similar structure as solar cell structure 100 shown in FIG. 1A. Therefore, the reflection and the transmission character of the light are also similar.

In addition, the cones, pyramids, or prisms mentioned above may also be a mix of cones, pyramids or prisms with different shapes in the horizontal cross-sectional view. The cones, pyramids, prisms which lie down horizontally or a mix of them may not be uniformed in arrangement or in sizes as in FIG. 4A. Because of the non-uniform in arrangement or in sizes, the vertical cross-section view may not be the same as in FIG. 4B due to the relatively flat portion. The relatively flat portion, however, will has slopes in accordance with the conditions of the present invention in the vertical cross-section view in another direction. Therefore, the vertical incident light on the portion with relatively flat slope can have multiple reflections still and more electrical power can be generated. Same as mentioned above, the slope of the side walls for the cones, pyramids or prisms may vary with the position on the side walls. Take the cone as an example, when a progressive shape is applied to, it becomes a shape like a bullet. Also same as mentioned above, in comparison with the case with a substantially fixed slope, a progressive type structure with the same slope at the peak has more reflections because the closer to the valley, the larger the slope is.

In practical application, thin film solar cell comprise several cells in series for higher voltage. The undulation used in the present invention can also be applied on the series-connecting area between two cells. There are three advantages: 1. The undulation will make a wider effective width to reduce the series resistance. 2. The undulation of the wasted areas may fit the undulation of the thin film solar cells of the present invention, so the surface structure of the substrate can be simpler. 3. There is a "wasted area" at the series connecting area (See the numeral 511 in FIG. 5A, this will be described in more detail later). In the wasted area with the prior art, most incident light will be reflected out and no electrical energy will be generate. The undulation can minimize the unsatisfactory effect cause by the wasted area.

Figure 5A:
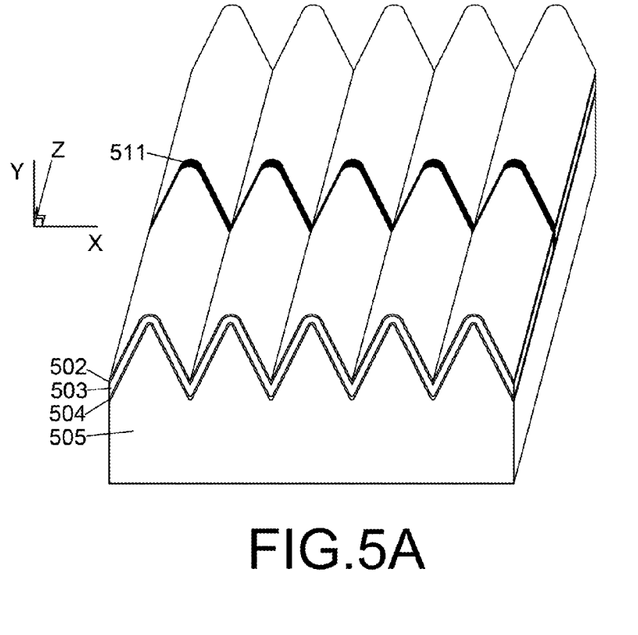
FIG. 5A is an undulated wasted area on the series-connecting area between two solar cells.
Figure 5B:
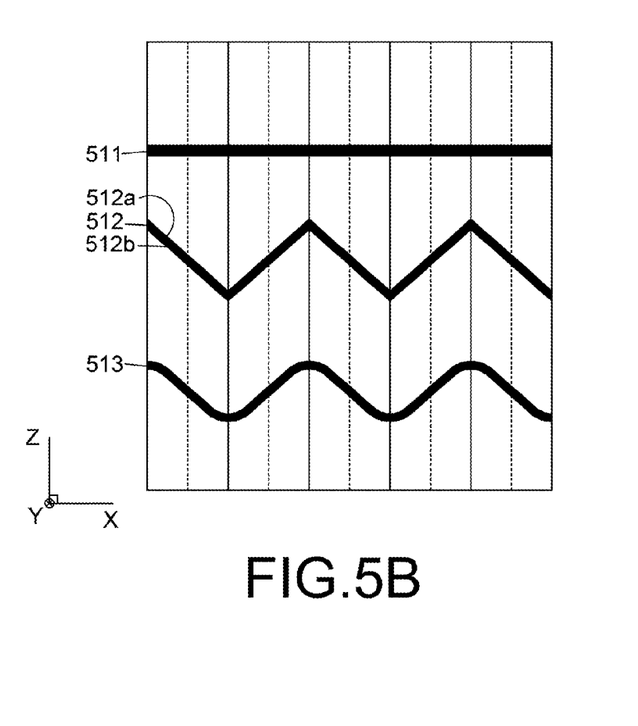
FIG. 5B is an aerial view of some patterns of the wasted area in the present invention.
Figure 5C:
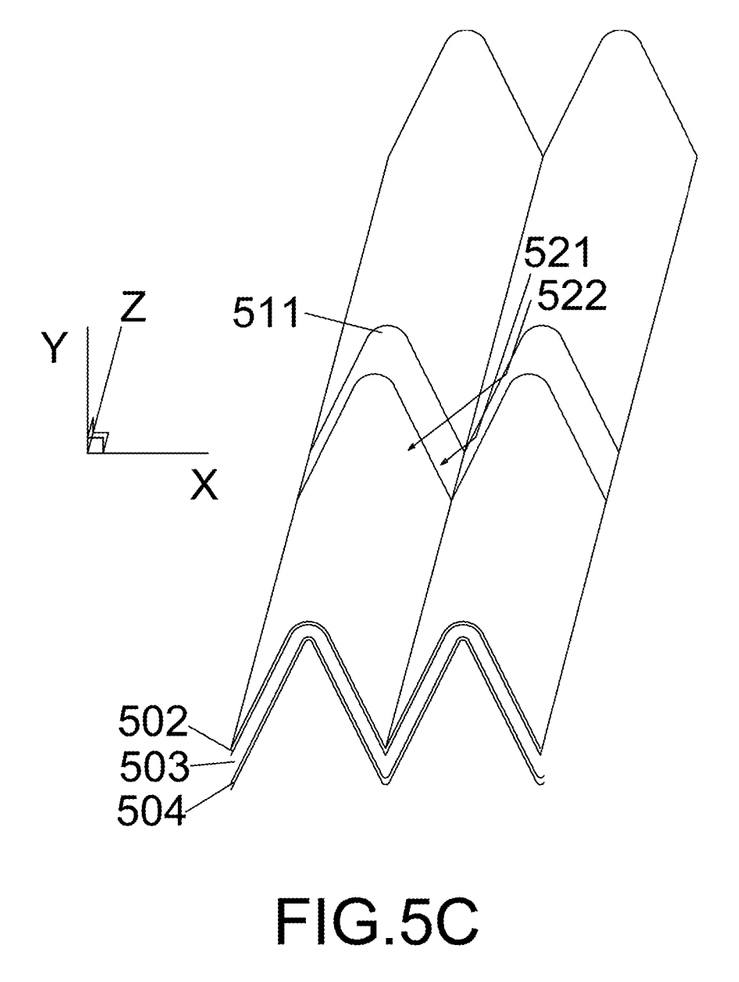
FIG. 5C is an example of an undulated wasted area and the tilt incident light on it.
Figure 6:
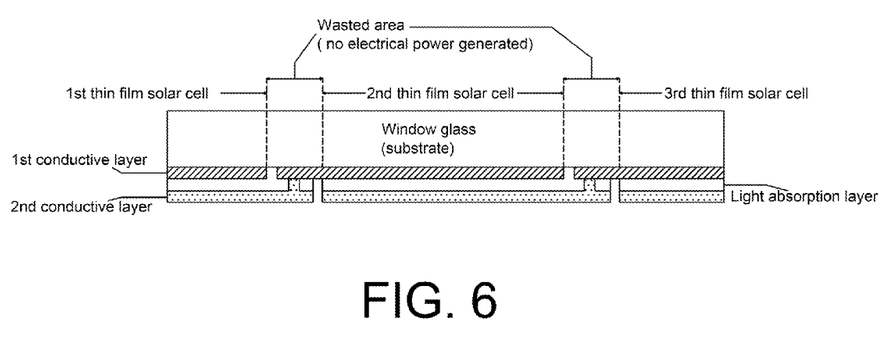
FIG. 6 is the wasted area in the longitudinal (ie. the direction of the series connection) section view of a traditional a-Si thin film solar cell.

FIG. 6 shows the wasted area in the longitudinal (ie. the direction of the series connection) section view of a traditional a-Si thin film solar cell. In dimension, the wasted area has a thickness, a length in the direction of the series connection and perpendicular to the direction of the thickness, and a width in the direction perpendicular to both the directions of the length and the thickness. The thickness of the wasted area is defined by the accumulated thickness of the first conductive layer, the light absorption layer and the second conductive layer. For a undulated wasted area 511 shown in FIG. 5C, a tilt incident light 521 which first contact the wasted area at a point closer to the valley will be reflected and contact the wasted area again on the other side of the V-groove, while the other tilt incident light 522 which first contact the wasted area at a point closer to the peak will be reflected and avoid to imping again to the wasted area on the other side of the V-groove. So, for a tilt incident light which is not on the vertical plane passing the wasted area, the more vertical distance between the peak and the neighbor valley of the undulation, the more percentage of light reflected to a light absorption layer somewhere else and be converted to electrical power. For the undulation of the light absorption layer (with also reference to FIG. 1C, the non-planar light absorption layer has peaks and valleys, at least one peak of the non-planar light absorption layer having a first upper portion on the first face and a first lower portion on the second face, at least one valley of the non-planar light absorption layer having a second upper portion on the first face and a second lower portion on the second face), the vertical distance between the first lower portion of one peak and the second lower portion of one valley adjacent to the peak had better to be larger than ½ of the length (ie. the Z-axis distance in FIG. 5A) of the wasted area. One exception is the incident light share the same vertical plane (EX. The X-Y plane in FIG. 5A) with the wasted area, which is reflected to the same wasted area till it leaves the thin film solar cell and no electrical power is generated. In addition to reduce the length (the Z-axis distance) of the wasted area, there is other way to convert more incident light on the wasted area to electrical power. That is to make some changes on the pattern of the wastes area extending along X-axis direction in FIG. 5B. The longitudinal sectional view of FIG. 5A alone Y-Z plane can also be referred to FIG. 6, even though the structure shown in FIG. 6 is traditional structure and does not have undulation alone the X-Y plane. The length of the wasted area is defined to be the length of area between the first thin film solar cell and the second thin film solar cell.

FIG. 5A shows an embodiment of the present invention, wherein the vertical distance between the first upper portion of one peak and the second lower portion of one valley adjacent to the peak is at least 10 times of a thickness of the light absorption layer, and the relatively flat portion on the second face thereof (the relatively flat portion is the portion having slope smaller than 45 degree to a horizontal plane) has an upper limit. Namely, a ratio of a horizontal projection of the relatively flat portion to a horizontal projection of the whole light absorption layer is less than 10%. There is a wasted area 511 on the series-connecting area between two solar cells. FIG. 5B shows wasted area 511 on an aerial view. Peaks and valleys are also shown as dashed lines and solid lines respectively in FIG. 5B. If an incident light lies on the same X-Y plane as the wasted area 511, the reflected light also lies on the same plane obviously. The light trajectory for the thin film solar cell will be kept on the wasted area 511 because the wasted area 511 is the intersection of the thin film solar cell structure and the X-Y plane shown in FIGS. 5A and 5B. So, no electrical power is generated there. To have as much incident light converted to electrical power as possible, it is desirable to let all the incident lights on the wasted area be reflected to the area which can convert the light to electrical power (namely, to non-wasted area). The way to achieve the target is to vary the wasted area in Z-axis (ie. the direction of the series connection) with its position on the thin film solar cell structure instead of a fixed Z in an X-Y plane. Namely, the projection of wasted areas 512 and 513 are not straight line on X-Z plane with reference to FIGS. 5A and 5B. The wasted areas 512 and 513 shown in FIG. 5B are used in another two embodiments of the present invention, where the projection of wasted area 512 is a zigzag line on X-Z plane while the projection of wasted area 513 is wave-like line on X-Z plane. The wasted area has a first interface to the first thin film solar cell and a second interface to the second thin film solar cell on the other side. For example, wasted area 512 has a first interface 512a and a second interface 512b. The first interface 512a also undulate in the length direction (ie. the direction of Z-axis) along with the location in the undulation and the second interface 512b also undulate in the length direction along with the location in the undulation, too. As an aerial view on the X-Z plane, FIG. 5B shows a clear picture of the shifts for the first interface 512a and the second interface 512b. Only one contact between a beam of light and a wasted area at most in the two embodiments even if the light is initially imping the wasted area along a direction on X-Y plane.

It should be noted that all the figures and examples are illustrative and should not be considered as limits.

What is claimed is:

1. A thin film solar cell structure, comprising:
    at least one non-planar light absorption layer having a first face and a second face opposite to the first face;
    a light transmissive first conductive layer arranged on the first face of the light absorption layer; and
    a second conductive layer arranged under the second face of the light absorption layer;
    wherein the non-planar light absorption layer has peaks and valleys, at least one peak of the non-planar light absorption layer having a first upper portion on the first face and a first lower portion on the second face, at least one valley of the non-planar light absorption layer having a second upper portion on the first face and a second lower portion on the second face, the lower portion of one peak being higher than the upper portion of one valley adjacent to the peak, a vertical distance between the first lower portion of one peak and the second lower portion of one valley adjacent to the peak is at least ten times of a thickness of the light absorption layer, the thickness of the light absorption layer being defined by the distance between the first upper portion and the first lower portion of one peak or the distance between the second upper portion and the second lower portion of one valley, the first conductive layer has uneven undulation substantially along with the light absorption layer;
    wherein the non-planar light absorption layer has a relatively flat portion on the second face thereof and the relatively flat portion having slope smaller than 50 degree to a horizontal plane,
    wherein both the peak and the valley of the non-planar light absorption layer have the relatively flat portion;
    wherein a ratio of a total sum of a horizontal projection of the relatively flat portion including in both of the peak and the valley of the non-planar light absorption layer to a horizontal projection of the whole light absorption layer is less than 25%, wherein the horizontal projection is a projected portion to an artificial plane on which a substrate of the thin film solar cell structure is placed;
    wherein a series-connecting area between any two neighbor thin film solar cells has a wasted area incapable of generating electrical power, the wasted area having a thickness, a length in the direction of the series connection and perpendicular to the direction of the thickness and an effective width in undulation on a substrate, the thickness of the wasted area being defined by the accumulated thickness of the first conductive layer, the light absorption layer and the second conductive layer at one peak or at one valley.

2. The thin film solar cell structure in claim 1, wherein the second conductive layer has a reflection rate larger than 20%.

3. The thin film solar cell structure in claim 1, wherein the light absorption layer has non-planar structures with undulated vertical cross-section along at least one dimension, the slope of the non-planar light absorption layer has a substantially fixed angle of 60 or 75 degree with respect to a horizontal plane.

4. The thin film solar cell structure in claim 1, wherein the light absorption layer has non-planar structures with undulated vertical cross-section along at least one dimension, the slope of the non-planar light absorption layer has a varying angle to a horizontal plane with position.

5. The thin film solar cell structure in claim 1,
    wherein the non-planar light absorption layer has peaks and valleys, at least one peak of the non-planar light absorption layer having a first upper portion on the first face and a first lower portion on the second face, at least one valley of the non-planar light absorption layer having a second upper portion on the first face and a second lower portion on the second face, the lower portion of one peak being higher than the upper portion of one valley adjacent to the peak, a vertical distance between the first lower portion of one peak and the second lower portion of one valley adjacent to the peak is at least ½ of the distance in the length direction of the wasted area, the thickness of the light absorption layer being defined by the distance between the first upper portion and the first lower portion of one peak or the distance between the second upper portion and the second lower portion of one valley, the first conductive layer has uneven undulation substantially along with the light absorption layer.

6. The thin film solar cell structure in claim 1,
    wherein the wasted area has a pattern varies in the direction of the length with its position on the thin film solar cell structure instead of lying on a plane perpendicular to the direction of the length.

7. The thin film solar cell structure in claim 1,
    wherein the wasted area has a first interface to the first thin film solar cell and a second interface to the second thin film solar cell on the other side, in addition to share the undulation with the light absorption layer, the first interface also undulates in the length direction along with the location in the undulation, the second interface also undulate in the length direction along with the location in the undulation.

8. The thin film solar cell structure in claim 1, wherein the horizontal projection of the relatively flat portion on the valley has no more area than the horizontal projection of the relatively flat portion on the peak does.

9. A thin film solar cell structure, comprising:
at least one non-planar light absorption layer having a first face and a second face opposite to the first face;
a light transmissive first conductive layer arranged on the first face of the light absorption layer; and
a second conductive layer arranged under the second face of the light absorption layer;
wherein the non-planar light absorption layer has peaks and valleys, at least one peak of the non-planar light absorption layer having a first upper portion on the first face and a first lower portion on the second face, at least one valley of the non-planar light absorption layer having a second upper portion on the first face and a second lower portion on the second face, the lower portion of one peak being higher than the upper portion of one valley adjacent to the peak, a vertical distance between the first lower portion of one peak and the second lower portion of one valley adjacent to the peak is at least ten times of a thickness of the light absorption layer, the thickness of the light absorption layer being defined by the distance between the first upper portion and the first lower portion of one peak or the distance between the second upper portion and the second lower portion of one valley, the first conductive layer has uneven undulation substantially along with the light absorption layer;
wherein the non-planar light absorption layer has a relatively flat portion on the second face thereof and the relatively flat portion having slope smaller than 60 degree to a horizontal plane,
wherein both the peak and the valley of the non-planar light absorption layer have the relatively flat portion;
wherein a ratio of a total sum of a horizontal projection of the relatively flat portion including in both of the peak and the valley of the non-planar light absorption layer to a horizontal projection of the whole light absorption layer is less than 50%, wherein the horizontal projection is a projected portion to an artificial plane on which a substrate of the thin film solar cell structure is placed;
wherein a series-connecting area between any two neighbor thin film solar cells has a wasted area incapable of generating electrical power, the wasted area having a thickness, a length in the direction of the series connection and perpendicular to the direction of the thickness and an effective width in undulation on a substrate, the thickness of the wasted area being defined by the accumulated thickness of the first conductive layer, the light absorption layer and the second conductive layer at one peak or at one valley.

10. The thin film solar cell structure in claim 9, wherein the second conductive layer has a reflection rate larger than 20%.

11. The thin film solar cell structure in claim 9, wherein the light absorption layer has non-planar structures with undulated vertical cross-section along at least one dimension, the slope of the non-planar light absorption layer has a substantially fixed angle of 60 or 75 degree with respect to a horizontal plane.

12. The thin film solar cell structure in claim 9, wherein the light absorption layer has non-planar structures with undulated vertical cross-section along at least one dimension, the slope of the non-planar light absorption layer has a varying angle to a horizontal plane with position.

13. The thin film solar cell structure in claim 9, wherein the non-planar light absorption layer has peaks and valleys, at least one peak of the non-planar light absorption layer having a first upper portion on the first face and a first lower portion on the second face, at least one valley of the non-planar light absorption layer having a second upper portion on the first face and a second lower portion on the second face, the lower portion of one peak being higher than the upper portion of one valley adjacent to the peak, a vertical distance between the first lower portion of one peak and the second lower portion of one valley adjacent to the peak is at least ½ of the distance in the length direction of the wasted area, the thickness of the light absorption layer being defined by the distance between the first upper portion and the first lower portion of one peak or the distance between the second upper portion and the second lower portion of one valley, the first conductive layer has uneven undulation substantially along with the light absorption layer.

14. The thin film solar cell structure in claim 9, wherein the wasted area has a pattern varies in the direction of the length with its position on the thin film solar cell structure instead of lying on a plane perpendicular to the direction of the length.

15. The thin film solar cell structure in claim 9, wherein the wasted area has a first interface to the first thin film solar cell and a second interface to the second thin film solar cell on the other side, in addition to share the undulation with the light absorption layer, the first interface also undulates in the length direction along with the location in the undulation, the second interface also undulate in the length direction along with the location in the undulation.

16. The thin film solar cell structure in claim 9, wherein the horizontal projection of the relatively flat portion on the valley has no more area than the horizontal projection of the relatively flat portion on the peak does.

* * * * *